(12) United States Patent
Gingrich, III

(10) Patent No.: US 9,578,767 B2
(45) Date of Patent: Feb. 21, 2017

(54) COVER FOR AN ELECTRONIC MODULE

(71) Applicant: Tyco Electronics Corporation, Berwyn, PA (US)

(72) Inventor: Charles Raymond Gingrich, III, Mechanicsburg, PA (US)

(73) Assignee: TYCO ELECTRONICS CORPORATION, Berwyn, PA (US)

(*) Notice: Subject to any disclaimer, the term of this patent is extended or adjusted under 35 U.S.C. 154(b) by 42 days.

(21) Appl. No.: 14/661,580

(22) Filed: Mar. 18, 2015

(65) Prior Publication Data
US 2016/0278225 A1 Sep. 22, 2016

(51) Int. Cl.
| H05K 7/00 | (2006.01) |
| H05K 5/03 | (2006.01) |
| H01R 13/52 | (2006.01) |
| H01R 13/658 | (2011.01) |
| H01R 13/66 | (2006.01) |
| H01R 13/6581 | (2011.01) |
| H05K 7/02 | (2006.01) |
| H01R 12/71 | (2011.01) |
| H01R 13/502 | (2006.01) |

(52) U.S. Cl.
CPC ............ *H05K 5/03* (2013.01); *H01R 13/5213* (2013.01); *H01R 13/658* (2013.01); *H01R 13/6581* (2013.01); *H01R 13/6658* (2013.01); *H05K 7/02* (2013.01); *H01R 12/714* (2013.01); *H01R 13/502* (2013.01)

(58) Field of Classification Search
USPC ............... 361/728–732, 752, 796, 816, 818
See application file for complete search history.

(56) References Cited

U.S. PATENT DOCUMENTS 4,829,432 A * 5/1989 Hershberger ........ H05K 9/0045
174/377
5,170,009 A * 12/1992 Kadokura .............. C09D 5/448
174/363

(Continued)

FOREIGN PATENT DOCUMENTS

DE 37 28 456 A1 3/1989
DE 195 16 936 A1 11/1996

(Continued)

OTHER PUBLICATIONS

International Search Report, Application No. PCT/US2016/020541, International Filing Date, Mar. 3, 2016.

*Primary Examiner* — Hung S Bui

(57) ABSTRACT

A cover for an electronic module that has a housing holding a electrical component and a circuit board for operating the electrical component includes a cover plate having an interior surface and an exterior surface. The cover plate has a dielectric body. A majority of at least one of the interior surface and the exterior surface includes a conductive layer to provide electrical shielding for the cover plate. A connector portion is formed integrally with the cover plate defining a unitary structure. The connector portion includes a plurality of contact channels and a shroud extending from the exterior surface that surrounds a receptacle configured to receive a plug connector therein. Contacts are held in corresponding contact channels that have mating ends positioned in the receptacle and mounting ends exposed beyond the interior surface for mounting to the circuit board.

20 Claims, 3 Drawing Sheets

(56) References Cited

U.S. PATENT DOCUMENTS

| | | | | |
|---|---|---|---|---|
| 5,872,332 | A * | 2/1999 | Verma | H05K 5/0047 |
| | | | | 174/373 |
| 6,102,744 | A * | 8/2000 | Korsunsky | H01R 12/721 |
| | | | | 439/637 |
| 6,606,252 | B1 * | 8/2003 | Snider | H05K 1/0268 |
| | | | | 174/262 |
| 6,709,291 | B1 * | 3/2004 | Wallace | H05K 5/0034 |
| | | | | 439/607.01 |
| 6,807,731 | B2 * | 10/2004 | Brandenburg | H05K 5/065 |
| | | | | 264/272.15 |
| 7,149,089 | B2 * | 12/2006 | Blasko | H01R 13/521 |
| | | | | 361/752 |
| 7,358,447 | B2 * | 4/2008 | Gabower | B29C 51/10 |
| | | | | 174/378 |
| 8,305,763 | B2 * | 11/2012 | Kato | H05K 5/006 |
| | | | | 361/730 |
| 2003/0161110 | A1 * | 8/2003 | Spasevski | H05K 7/20854 |
| | | | | 361/715 |
| 2004/0087196 | A1 * | 5/2004 | Lang | H01R 13/514 |
| | | | | 439/181 |
| 2004/0235317 | A1 * | 11/2004 | Schiefer | H05K 1/181 |
| | | | | 439/76.2 |
| 2014/0030931 | A1 * | 1/2014 | Seitz | H01R 24/76 |
| | | | | 439/682 |

FOREIGN PATENT DOCUMENTS

| | | |
|---|---|---|
| DE | 101 46 093 A1 | 4/2003 |
| TW | M462 998 U | 10/2013 |

* cited by examiner

COVER FOR AN ELECTRONIC MODULE

BACKGROUND OF THE INVENTION

The subject matter herein relates generally to covers for electronic modules.

Electronic modules, such as lamp assemblies, typically have a housing or enclosure that houses electrical components, such as a lighting element, a circuit board for controlling operation of the electrical components and wires or electrical connectors that supply power to the electrical components. Conventional lamp assemblies typically include a header connector that is mounted to the circuit board. A cover includes an opening therethrough and a shroud configured to receive a plug connector. In at least some known lamp assemblies, the housing is manufactured from a metal material to provide electrical shielding. The header connector is aligned with and passes into the shroud for electrical connection to the plug connector. However, alignment of the header connector with the opening in the cover is problematic and misalignment may lead to contact stubbing. Furthermore, sealing of the opening is typically required between the interior shroud surface and the header connector, leading to tight tolerances of the location and sizing of the header connector and the shroud.

To overcome the alignment problems with some conventional assemblies, at least some known assemblies attach the header connector to the cover prior to coupling the cover to the enclosure. The header connector is made to precisely fit in the opening in the cover for sealing of the header connector to the cover. The two-piece design requires time for assembly and requires the parts to be manufactured to tight tolerances, which increases the overall cost of the product. Additionally, problems arise over time of the header assembly vibrating out of the shroud after continued use, which leads to failure of the lamp assembly.

BRIEF DESCRIPTION OF THE INVENTION

In one embodiment, a cover is provided for an electronic module that has a housing holding a electrical component and a circuit board for operating the electrical component. The cover includes a cover plate having an interior surface and an exterior surface extending to an outer perimeter. The cover plate has a dielectric body. The interior surface is configured to face an interior of the housing and the circuit board. The cover plate is generally planar. A majority of at least one of the interior surface and the exterior surface includes a conductive layer to provide electrical shielding for the cover plate. A connector portion is formed integrally with the cover plate. The connector portion and cover plate define a unitary structure. The connector portion includes a plurality of contact channels formed therethrough. The connector portion includes a shroud extending from the exterior surface of the cover plate. The shroud surrounds a receptacle configured to receive a plug connector therein. A plurality of contacts are held in corresponding contact channels. The contacts have mating ends positioned in the receptacle for mating with the plug connector. The contacts have mounting ends exposed beyond the interior surface for mounting to the circuit board.

In a further embodiment, an electronic module is provided including a housing having a chamber and an open end, a electrical component in the chamber, a circuit board in the chamber and operably coupled to the electrical component, and a cover coupled to the housing. The cover includes a cover plate having an interior surface and an exterior surface extending to an outer perimeter. The cover plate has a dielectric body. The interior surface is configured to face an interior of the housing and the circuit board. The cover plate is generally planar. A majority of at least one of the interior surface and the exterior surface includes a conductive layer to provide electrical shielding for the cover plate. A connector portion is formed integrally with the cover plate. The connector portion and cover plate define a unitary structure. The connector portion includes a plurality of contact channels formed therethrough. The connector portion includes a shroud extending from the exterior surface of the cover plate. The shroud surrounds a receptacle configured to receive a plug connector therein. A plurality of contacts are held in corresponding contact channels. The contacts have mating ends positioned in the receptacle for mating with the plug connector. The contacts have mounting ends exposed beyond the interior surface for mounting to the circuit board.

DETAILED DESCRIPTION OF THE INVENTION

Figure 1:
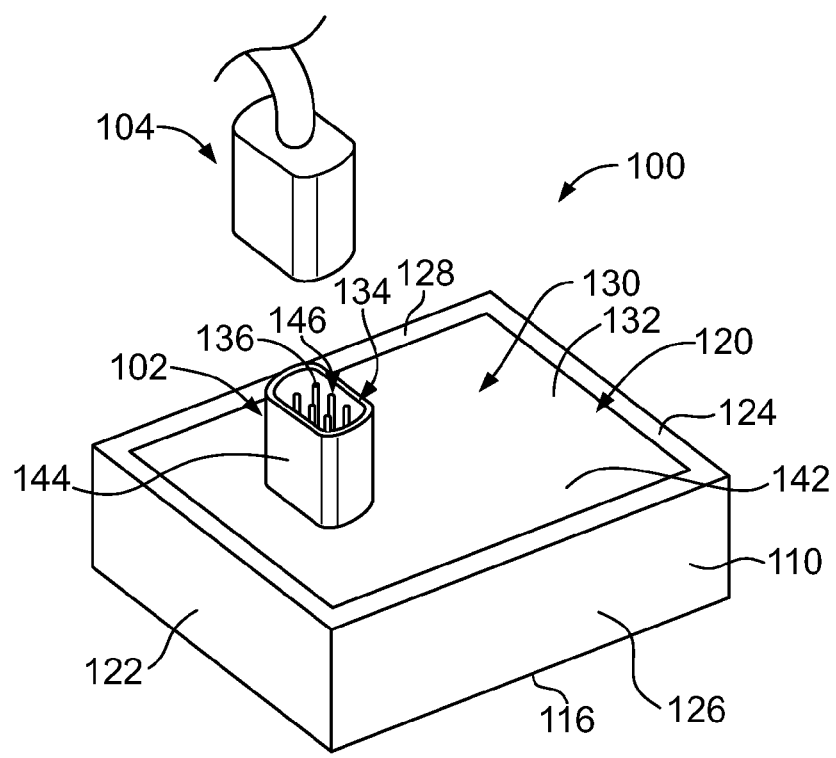
FIG. 1 is a perspective view of an electronic module formed in accordance with an exemplary embodiment.
Figure 2:
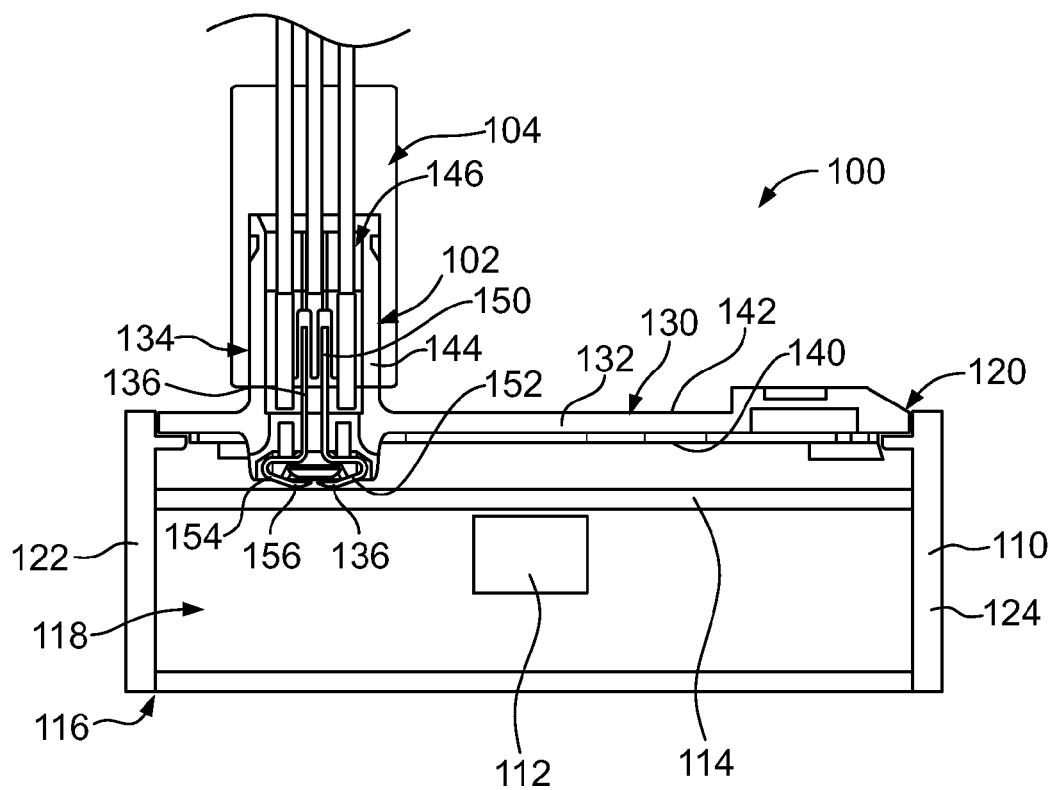
FIG. 2 is a cross-sectional view of the electronic module.

FIG. 1 is a perspective view of an electronic module 100 formed in accordance with an exemplary embodiment. FIG. 2 is a cross-sectional view of the electronic module 100. The electronic module 100 has an electrical connector 102 configured to be electrically connected to a plug connector 104. Optionally, the plug connector 104 may be a power connector configured to supply power to the electronic module 100; however the plug connector 104 may additionally or alternatively transmit data signals.

In an exemplary embodiment, the electronic module 100 is a lamp assembly and may be referred to hereinafter as a lamp assembly 100. While various features are described herein with reference to a lamp assembly, the subject matter described herein is applicable to other types of electronic modules 100 and is not intended to be limited to a lamp assembly. In an exemplary embodiment, the electronic module 100 may be used in an automotive application; however, the subject matter described herein is not intended to be limited to automotive applications. The electronic module 100 may be used in industrial applications, aeronautical applications, computer applications, machinery, and the like.

The lamp assembly 100 has a housing 110 holding and/or enclosing various electrical components of the lamp assembly 100. For example, the housing 110 may hold an electrical component 112 and a circuit board 114 for operating the electrical component 112. In an exemplary embodiment, the electrical component 112 may be a lighting element and may be referred to hereinafter as a lighting element 112. Other electrical components may be held in the housing 110 in alternative embodiments and the subject matter herein is not intended to be limited to lighting elements. The lighting element 112 may be directly or indirectly connected to the circuit board 114. The electrical connector 102 is electrically connected to the circuit board 114. The plug connector 104 is configured to be electrically connected to the electrical connector 102, such as to supply power to the circuit board 114 through the electrical connector 102. The circuit board 114 may provide power to other electrical components in alternative embodiments.

In the illustrated embodiment, the housing 110 has a light emitting end 116 and the lighting element 112 is configured to emit light through the light emitting end 116. The light emitting end 116 may be covered by a lens or other optical element in various embodiments. The housing 110 defines a chamber 118 between the light emitting end 116 and an open end 120 opposite the light emitting end 116. The lighting elements 112 and the circuit board 114 may be received in the chamber 118, such as through the open end 120.

The open end 120 is closed by a cover 130 coupled to the housing 110. In an exemplary embodiment, the electrical connector 102 is an integral part of the cover 130. The cover 130 may be sealed to the housing 110. Optionally, a gasket may be provided between the cover 130 and the housing 110. In an exemplary embodiment, the cover 130 provides electrical shielding for the housing 110, such as to prevent electromagnetic interference (EMI) through the open end 120.

In an exemplary embodiment, the open end 120 is defined between opposite end walls 122, 124 and opposite side walls 126, 128. The open end 120 may extend substantially the entire length and width of the housing 110. In an exemplary embodiment, the open end 120 is sized to allow the circuit board 114 to be loaded into the housing 110 through the open end 120. The housing 110 may have any shape. In the illustrated embodiment, the housing 110 has a generally rectangular shape between the end walls 122, 124 and the side walls 126, 128; however, the housing 110 may have other shapes in alternative embodiments. The cover 130 is sized and shaped to cover the open end 120. For example, the cover 130 extends between the end walls 122, 124 and the side walls 126, 128.

The cover 130 has a cover plate 132, a connector portion 134 formed integrally with the cover plate 132 and a plurality of contacts 136 in the connector portion 134. The connector portion 134 and contacts 136 define the electrical connector 102 configured to be mated with the plug connector 104. The cover plate 132 has an interior surface 140 and an exterior surface 142 opposite the interior surface 140. The interior surface 140 faces the chamber 118 in the interior of the housing 110. The interior surface 140 faces the circuit board 114.

The connector portion 134 has a shroud 144 extending from the exterior surface 142. The shroud 144 surrounds the contacts 136. The plug connector 104 is configured to be coupled to the shroud 144 to electrically connector the contacts 136 to corresponding mating contacts of the plug connector 104. For example, the shroud 144 defines a receptacle 146 that receives a portion of the plug connector 104. The contacts 136 are contained within the receptacle 146.

In an exemplary embodiment, the contacts 136 have mating ends 150 positioned in the receptacle 146 for mating with the plug connector 104. The contacts 136 have mounting ends 152 exposed beyond the interior surface 140 for mounting to the circuit board 114. In an exemplary embodiment, the mounting ends 152 are bent, such as into a U-shape, to form spring beams 154. The spring beams 154 are configured to spring bias the mounting ends 152 against the circuit board 114. For example, when the cover 130 is coupled to the housing 110, the mounting ends 152 are elastically deformed against the circuit board 114. When the spring beams 154 are elastically deformed, the spring beams 154 are spring biased against the circuit board 114 to ensure that the contacts 136 maintain an electrical connection with the circuit board 114. In an exemplary embodiment, the mounting ends 152 have protrusions 156 in the form of bumps at or near distal ends of the mounting ends 152. The protrusions 156 define mating interfaces of the contacts 136 with the circuit board 114. The mating interfaces are separable mating interfaces configured to be readily and repeatedly mated to and unmated from the circuit board 114 as the cover 130 is coupled to and uncoupled from the housing 110 without damaging the contacts 136. The curved profile of the protrusions 156 ensure that the contacts 136 maintain good electrical contact with the circuit board 114.

Figure 3:
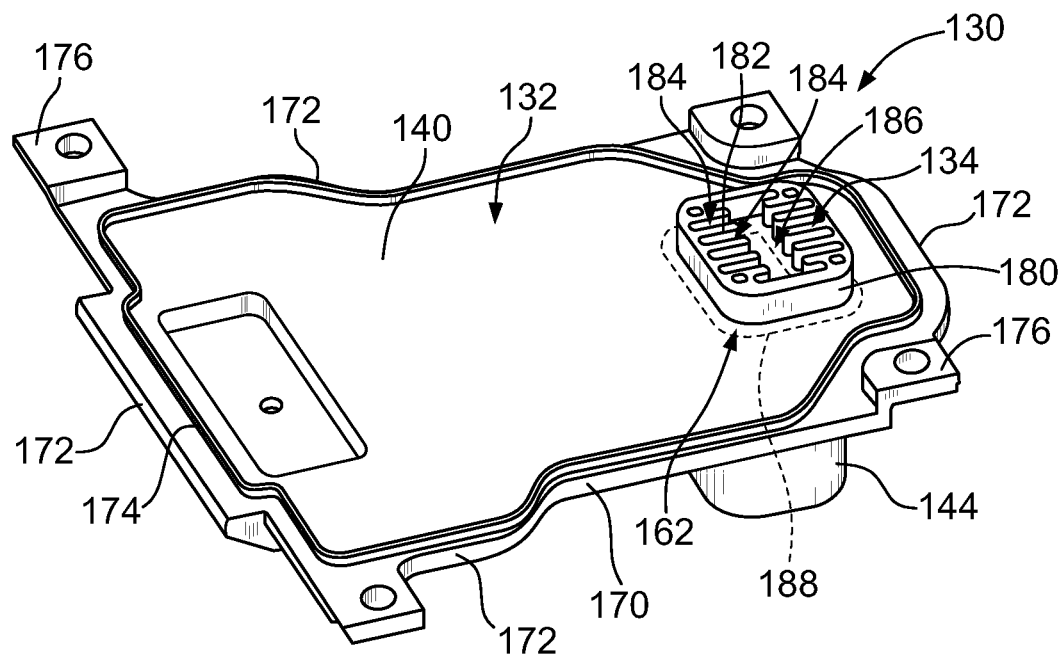
FIG. 3 is a perspective view of an interior surface of a cover of the electronic module.
Figure 4:
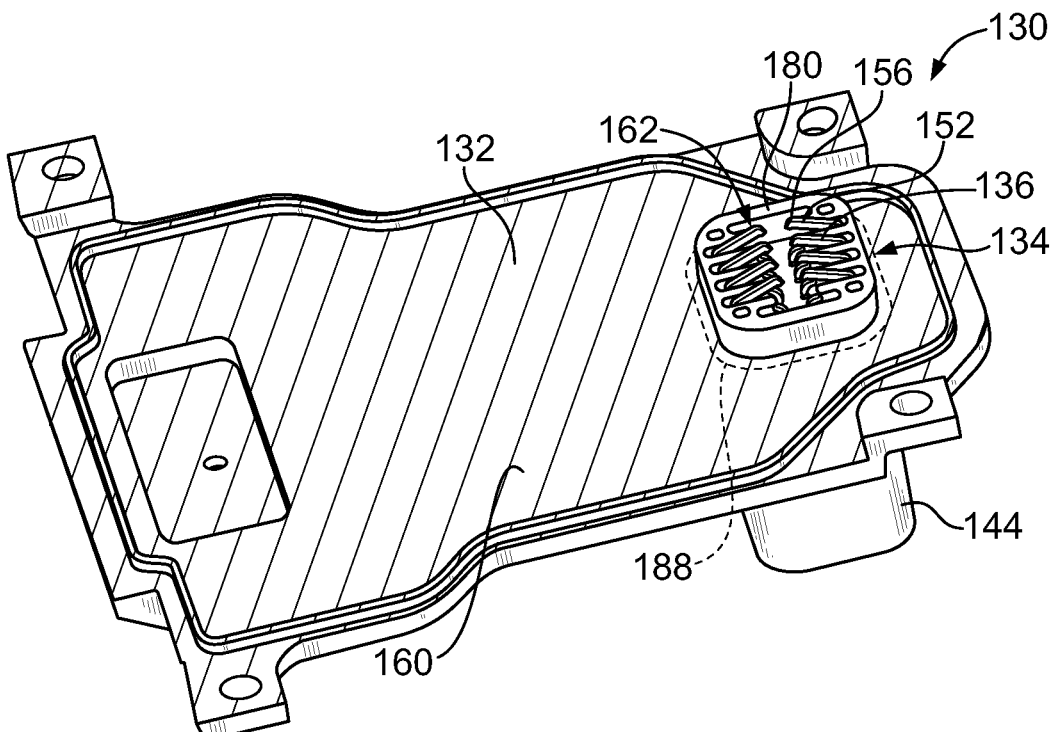
FIG. 4 is a perspective view of the interior surface of the cover with a conductive layer applied thereto.

FIG. 3 is a perspective view of the interior surface 140 of the cover 130. FIG. 4 is a perspective view of the interior surface 140 of the cover 130 with a conductive layer 160 applied thereto. The conductive layer 160 is represented by the cross-hatched area in FIG. 4. The conductive layer 160 provides electrical shielding for the cover plate 132.

In an exemplary embodiment, the conductive layer 160 is selectively applied to the interior surface 140. For example, selected or predefined areas of the interior surface 140 are not covered by the conductive layer 160 while other selected or predefined areas of the interior surface 140 are covered by the conductive layer 160. The conductive layer 160 may cover a majority of the interior surface 140 of the cover plate 132. In an exemplary embodiment, the conductive layer 160 covers substantially the entire interior surface 140 of the cover plate 132. Optionally, a contact region 162 surrounding the mating ends 150 of the contacts 136 may not be covered by the conductive layer 160, but substantially the entire remainder of the interior surface 140 is covered by the conductive layer 160. As such, the conductive layer 160 provides electrical shielding all around the contact region 162, but in the contact region 162 the conductive layer 160 does not electrically short between the contacts 136.

In an exemplary embodiment, the conductive layer 160 is a plated conductive layer. The conductive layer 160 is plated over the pre-selected areas of the interior surface 140. Optionally, the conductive layer 160 may be plated by metalizing the cover plate 132, however the cover plate 132 may be coated by other techniques in alternative embodiments. Optionally, the uncoated areas may be masked during the coating process such that the conductive layer 160 is selectively deposited in the pre-selected areas.

In an exemplary embodiment, the cover plate 132 includes a dielectric body 170. For example, the cover plate 132 may be formed by injection molding with a dielectric material, such as a plastic material. In an exemplary embodiment, the connector portion 134 is co-molded with the cover plate 132. For example, the structure of the connector portion 134 is injection molded with plastic material during molding of the cover plate 132. Using a dielectric material as the base material for the cover 130 that is then coated with the conductive layer 160, as compared to an all metal cover, reduces the cost of the materials to manufacture the cover 130. Additionally, the weight of the cover 130 may be reduced with the use of a plastic cover as opposed to a metal cover, which may have advantages in certain applications, such as electric vehicles, where weight concerns are important.

Optionally, the cover plate 132 may be generally planar and have an outer edge defining an outer perimeter 172 of the cover plate 132. The outer perimeter 172 may be complementary in shape to the open end 120 of the housing 110 (both shown in FIG. 1). Optionally, the cover plate 132 may have a rim 174 extending from the interior surface 140. The rim 174 may be configured to extend into the housing 110 when the cover 130 is coupled to the housing 110. Optionally, a seal may extend around the rim 174 for sealing to the housing 110. Optionally, the conductive layer 160 may be provided inside the rim 174, while the area of the interior surface 140 outside of the rim 174 is uncoated and does not include a conductive layer 160. Alternatively, the conductive layer 160 may be provided both inside the rim 174 and outside the rim 174. In an exemplary embodiment, the cover plate 132 includes a plurality of mounting tabs 176 extending from the interior surface 140. The mounting tabs 176 may be used to mount the cover 130 to the housing 110. For example, fasteners may extend through opening in the mounting tabs 176 to secure the cover 130 to the housing 110. The mounting tabs 176 may be coated with the conductive layer 160 in various embodiments.

In an exemplary embodiment, the cover 130 includes a platform 180 extending from the interior surface 140. The platform 180 may define a part of the connector portion 134. The platform 180 may be partially covered by the conductive layer 160, such as along a portion of the sidewalls but not on the end wall (e.g., interior wall). Alternatively, the conductive layer 160 may extend along the cover plate 132 up to, but not on, the platform 180.

The platform 180 has a plurality of separating walls 182 defining grooves 184. In an exemplary embodiment, a plurality of contact channels 186 extend through the platform 180 and/or the connector portion 134. The contact channels 186 receive corresponding contacts 136 (as shown in FIG. 4). The contact channels 186 are associated with corresponding grooves 184. For example, the grooves 184 receive the mounting ends 152 and the contact channels 186 receive the mating ends 150 of corresponding contacts 136. The separating walls 182 separate the contacts 136 from each other to position the contacts 136 and/or to electrically isolate the contacts 136 from each other. Optionally, the spring beams 154 of the contacts 136 are received in the grooves 184 while distal ends of the mating ends 152, including the protrusions 156, extend beyond the end wall of the platform 180 and are exposed for mating engagement with the circuit board 114 (shown in FIG. 2).

The platform 180 is formed integral with the cover plate 132. The contact channels 186 extend through the cover plate 132 to allow the contacts 136 to extend into the shroud 144. The shroud 144 is generally aligned with the platform 180 except that the contacts 136 may extend from the platform 180 into the shroud 144. Optionally, a perimeter 188 (shown in phantom in FIGS. 3 and 4) of the shroud 144 may surround the platform 180. For example, the shroud 144 may have a larger footprint than the platform 180 such that the platform 180 may be entirely contained within the perimeter 188 of the shroud 144. In an exemplary embodiment, the conductive layer 160 extends to the perimeter 188. The conductive layer 160 may extend into the perimeter 188, such as to the platform 180. Optionally, the shroud 144 may have a conductive layer working with the conductive layer 160 to provide electrical shielding for the entire cover 130. For example, the conductive layer 160 may at least partially overlap the conductive layer of the shroud 144 such that the entire cover 130 is electrically shielded, even along the area of the platform that is devoid of the conductive layer 160 (e.g., from the exterior side of the cover).

Figure 5:
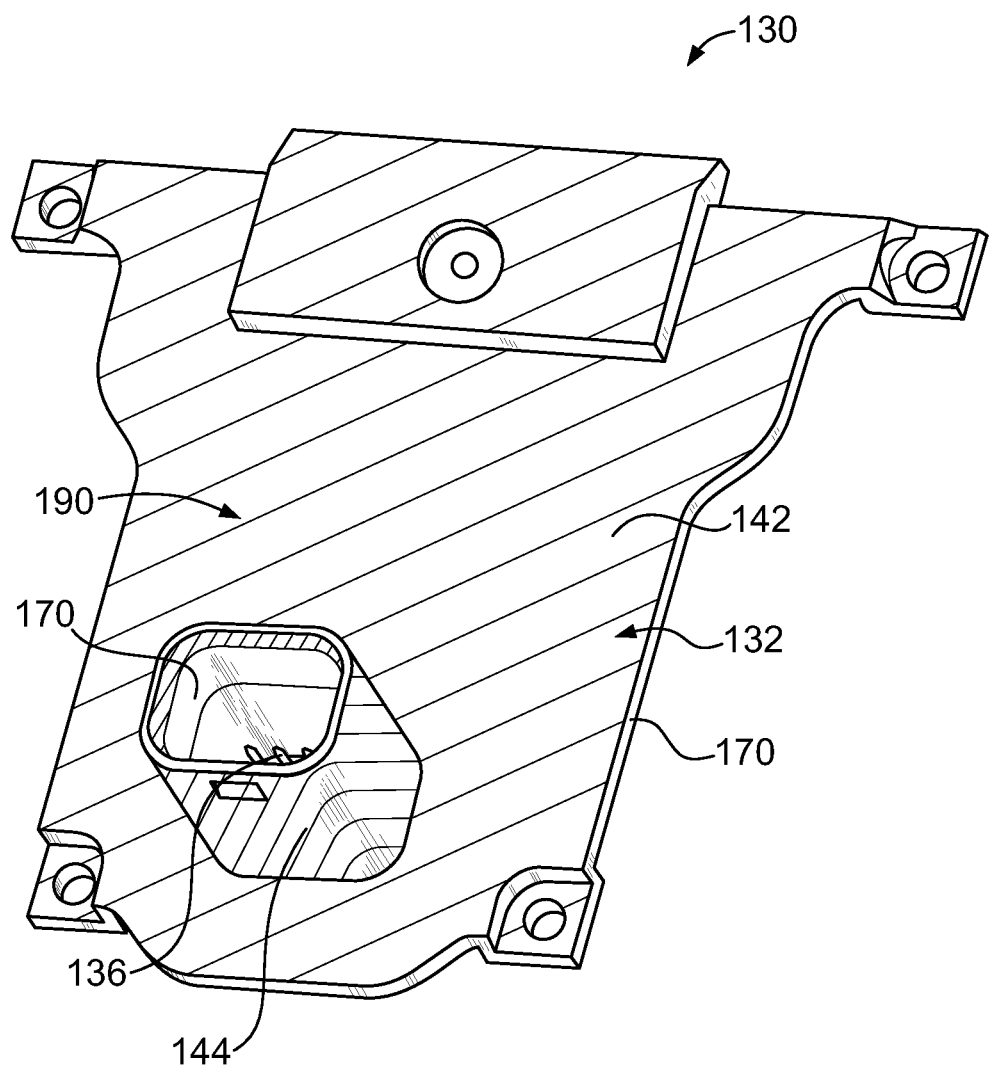
FIG. 5 is a perspective view of an exterior surface of the cover with a conductive layer applied thereto.

FIG. 5 is a perspective view of the exterior surface 142 of the cover 130 with a conductive layer 190 applied thereto. The conductive layer 190 is represented by the cross-hatched area in FIG. 5. The conductive layer 190 provides electrical shielding for the cover plate 132. The conductive layer 190 may be used in lieu of or in addition to the conductive layer 160 (shown in FIG. 4). For example, rather than providing the conductive layer 160, the interior surface 140 may be devoid of any metal coating or other structure defining a conductive layer, but rather, all of the electrical shielding of the cover 130 is provided by the conductive layer 190 on the exterior surface 142. However, in other alternative embodiments, the exterior surface 142 may not include any conductive layer.

In an exemplary embodiment, the conductive layer 190 is selectively applied to the interior surface 140. For example, selected or predefined areas of the exterior surface 142 are not covered by the conductive layer 190 while other selected or predefined areas of the exterior surface 142 are covered by the conductive layer 190. The conductive layer 190 may cover a majority of the exterior surface 142 of the cover plate 132. In an exemplary embodiment, the conductive layer 190 covers substantially the entire exterior surface 142 of the cover plate 132 and covers at least portions of the exterior and/or interior of the shroud 144. The conductive layer 190 may be applied to portions of the shroud 144 that mate with the plug connector 104 (shown in FIG. 1) to allow the plug connector 104 to be electrically grounded to the cover 130. For example, the plug connector 104 may engage the exterior of the shroud 144, and such exterior may be plated or otherwise have the conductive layer 190 in such location. The plug connector 104 may engage the interior of the shroud 144, and such interior may be plated or otherwise have the conductive layer 190 in such location. The cover may be electrically connected to the housing 110 (shown in FIG. 1) to electrically common the cover 130 and the housing 110.

In an exemplary embodiment, the conductive layer 190 is a plated conductive layer. The conductive layer 190 is plated over the pre-selected areas of the exterior surface 142. Optionally, the conductive layer 190 may be plated by metalizing the cover plate 132, however the cover plate 132 may be coated by other techniques in alternative embodiments. Optionally, the uncoated areas may be masked during the coating process such that the conductive layer 190 is selectively deposited in the pre-selected areas.

In other various embodiments, rather than masking, the dielectric body 170 may be manufactured in a way such that predetermined areas of the dielectric body 170 are configured to be plated while other predetermined areas of the dielectric body 170 are configured to resist plating. For example, the dielectric body 170 may be manufactured by a multi-stage injection molding process where different materials are injected at different stages of the injection molding. For example, a first material may be used for molding certain areas, such as the cover plate 132 and the shroud, while a second material may be used for molding certain other areas, such as the platform 180 (shown in FIG. 4). The first material may be a dielectric material that accepts plating and allows plating to occur on the surface thereof, whereas the second material may be a dielectric material that resists or repels plating material. In other various embodiments, the first material may be a conductive material, such as a metal infused dielectric (e.g., dielectric with silver particles or other metal particles embedded therein) or a metal material, and the second material may be a non-conductive material, such as a plastic material, that are co-molded as part of the multi-stage molding operation.

In an exemplary embodiment, the shroud 144 is co-molded with the cover plate 132. For example, the structure of the shroud 144 is injection molded during molding of the cover plate 132. The shroud 144 is generally aligned with the platform 180 (shown in FIGS. 3 and 4) to accept the contacts 136 through the contact channels 186.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A cover for an electronic module, the electronic module having a housing holding an electrical component and a circuit board for operating the electrical component, the cover comprising:
   a cover plate having an interior surface and an exterior surface extending to an outer perimeter, the cover plate having a dielectric body, the interior surface configured to face an interior of the housing and the circuit board, the cover plate being generally planar, wherein a majority of at least one of the interior surface and the exterior surface includes a conductive layer to provide electrical shielding for the cover plate;
   a connector portion formed integrally with the cover plate, the connector portion and cover plate defining a unitary structure, the connector portion comprising a plurality of contact channels formed therethrough, the connector portion comprising a shroud extending from the exterior surface of the cover plate, the shroud surrounding a receptacle configured to receive a plug connector therein; and
   a plurality of contacts held in corresponding contact channels, the contacts having mating ends positioned in the receptacle for mating with the plug connector, the contacts having mounting ends exposed beyond the interior surface for mounting to the circuit board;
   wherein the conductive layer is remote from the contact channels such that the dielectric body of the cover plate is provided between the conductive layer and the contact channels to electrically isolate the contacts from the conductive layer.

2. The cover of claim 1, wherein the cover plate is co-molded with the connector portion.

3. The cover of claim 1, wherein the dielectric body is a molded dielectric body with the shroud co-molded with the cover plate.

4. The cover of claim 1, wherein the conductive layer is a plated conductive layer plated on the exterior surface of the cover plate.

5. The cover of claim 1, wherein the conductive layer is a plated conductive layer plated on the interior surface of the cover plate.

6. The cover of claim 1, wherein the conductive layer is a plated conductive layer plated on both the exterior surface and the interior surface of the cover plate.

7. The cover of claim 1, wherein the conductive layer is provided on the shroud.

8. The cover of claim 1, wherein the cover plate is selectively plated to define the conductive layer.

9. The cover of claim 1, wherein the cover plate comprises a platform extending from the interior surface, the entire interior surface except for the platform being covered by the conductive layer.

10. The cover of claim 1, wherein the cover plate comprises a platform extending from the interior surface, the platform having a plurality of separating walls defining grooves, the mounting ends of the contacts being received in corresponding grooves, the separating walls separating the contacts from each other.

11. The cover of claim 1, wherein the cover plate defines a contact region surrounding the mating ends of the contacts, the conductive layer covering the entire interior surface except for the contact region immediately around the mounting ends of the contacts.

12. The cover of claim 1, wherein the cover plate is molded with a first material and the cover plate is molded with a second material, the first material being conductive, the second material being non-conductive.

13. The cover of claim 1, wherein the cover plate is molded with a first material and the cover plate is molded with a second material, the first material being configured to accept plating material used to form the conductive layer, the second material being configured to repel plating material.

14. The cover of claim 1, wherein the cover plate comprises strengthening ribs.

15. A electronic module comprising:
   a housing having a chamber and an open end;
   an electrical component in the chamber;
   a circuit board in the chamber and operably coupled to the electrical component; and
   a cover coupled to the housing, the cover comprising:
   a cover plate having an interior surface and an exterior surface extending to an outer perimeter, the cover plate having a dielectric body, the interior surface facing the chamber of the housing and the circuit board, the cover plate being generally planar, wherein a majority of at least one of the interior surface and the exterior surface includes a conductive layer to provide electrical shielding for the cover plate;
   a connector portion formed integrally with the cover plate, the connector portion and cover plate defining a unitary structure, the connector portion comprising a plurality of contact channels formed therethrough, the connector portion comprising a shroud extending from the exterior surface of the cover plate, the shroud surrounding a receptacle configured to receive a plug connector therein; and
   a plurality of contacts held in corresponding contact channels, the contacts having mating ends positioned in the receptacle for mating with the plug connector, the contacts having mounting ends exposed beyond the interior surface for mounting to the circuit board;

wherein the conductive layer is remote from the contact channels such that the dielectric body of the cover plate is provided between the conductive layer and the contact channels to electrically isolate the contacts from the conductive layer.

16. The electronic module of claim 15, wherein the cover plate is co-molded with the connector portion.

17. The electronic module of claim 15, wherein the dielectric body is a molded dielectric body with the shroud co-molded with the cover plate.

18. The electronic module of claim 15, wherein the conductive layer is a plated conductive layer plated on at least one of the exterior surface and the interior surface of the cover plate.

19. The electronic module of claim 15, wherein the cover plate comprises a platform extending from the interior surface, the entire interior surface except for the platform being covered by the conductive layer.

20. The electronic module of claim 15, wherein the cover plate is molded with a first material and the cover plate is molded with a second material, the first material being configured to accept plating material used to form the conductive layer, the second material being configured to repel plating material.

* * * * *